(12) United States Patent
Kim

(10) Patent No.: US 6,781,455 B2
(45) Date of Patent: Aug. 24, 2004

(54) HIGH EFFICIENCY POWER AMPLIFIER

(75) Inventor: Song-Gang Kim, Daejeon (KR)

(73) Assignee: Techno Electronics Industries Co., Ltd., Gyeonggi-Do (KR)

(*) Notice: Subject to any disclaimer, the term of this patent is extended or adjusted under 35 U.S.C. 154(b) by 0 days.

(21) Appl. No.: 10/351,225

(22) Filed: Jan. 24, 2003

(65) Prior Publication Data

US 2003/0222709 A1 Dec. 4, 2003

(30) Foreign Application Priority Data

Jun. 1, 2002 (KR) .................................. 10-2002-0030899

(51) Int. Cl.[7] .............................. H03F 1/14; H03F 3/68; H03F 3/04
(52) U.S. Cl. ...................... 330/51; 330/124 R; 330/310
(58) Field of Search .............................. 330/51, 124 R, 330/310

(56) References Cited

U.S. PATENT DOCUMENTS

| | | | |
|---|---|---|---|
| 5,661,434 A | * 8/1997 | Brozovich et al. | ............ 330/51 |
| 5,973,557 A | * 10/1999 | Miyaji et al. | ................. 330/51 |
| 6,208,203 B1 | * 3/2001 | Jung et al. | .................... 330/51 |
| 6,630,867 B2 | * 10/2003 | Canyon et al. | ............. 330/297 |

FOREIGN PATENT DOCUMENTS

JP 02002271152 A * 9/2002

* cited by examiner

*Primary Examiner*—Patricia Nguyen
(74) *Attorney, Agent, or Firm*—Darby & Darby

(57) ABSTRACT

The present invention discloses a high efficiency power amplifier comprising: an input matching unit for matching input signal; a first amplifying means for amplifying the signal outputted from the input matching unit; a second amplifying means for amplifying the signal outputted from the input matching unit; an output matching unit for performing an impedance matching the amplified signal from the first and second amplifying means and outputting the matched signal through an output terminal; a first power control path for electrically connecting between the input matching unit and the output matching unit and including the first amplifying means; a second power control path for electrically connecting between the input matching unit and the output matching unit and including the second amplifying means; a bypass path for electrically connecting between the input matching unit and the output matching unit; and a control circuit unit for selectively outputting the predetermined path control signals to the first and second amplifying means on the basis of an antennal output signal outputted and applied from a predetermined control module like an MSM (Mobile Station Modem).

17 Claims, 2 Drawing Sheets

HIGH EFFICIENCY POWER AMPLIFIER

BACKGROUND OF THE INVENTION

1. Field of the Invention

The present invention relates to a high efficiency power amplifier, more particularly, to a high efficiency power amplifier which may lengthen the telephone call time of a mobile communication terminal by improving efficiency of a power amplifier.

2. Description of the Background Art

Recently, there are several methods, such as, a method by using a DC-DC converter, a switching method, a bias control method, for increasing the efficiency of the power amplifier, which has been used to the mobile communication terminal.

In the method by using the DC-DC converter or the bias control method, it is difficult to maintain a linearity of a load line because of the continuous change of the load line, especially, in the method by using the DC-DC converter, the cost and the size of the device are increased, so that it is difficult to increase the efficiency of the power amplifier.

Also, when a matching process is performed by using the switching method, a loss by the switch is generated and also the matching point is moved by the switch, so that it is difficult to implement a power amplifier having the reliability.

As described above, although the power amplifiers of the conventional methods are designed to provide the maximum PAE (Power Added Efficiency) (about 35%) at the maximum output power of 28 dBm, the efficiency is about 5–7% at 16 dBm of high frequency, most of the input power is radiated by heat. The word of dBm is an abbreviated word of decibels above 1 milliwatt.

SUMMARY OF THE INVENTION

Accordingly, it is a primary object of the present invention to provide a high efficiency power amplifier which has two or more optimization output points providing the maximum efficiency.

Another object of the present invention is to provide a high efficiency power amplifier which increases the efficiency of the power amplifier of the mobile communication terminal by decreasing the power consumption, thereby capable of extending the telephone call time and continuous use time.

In one aspect of the present invention, to achieve the above-described objects of the invention, there is provided a high efficiency power amplifier comprising:

an input matching unit for matching the predetermined input signal to the next terminal;

a first amplifying means for amplifying the signal outputted from the input matching unit;

a second amplifying means, which is electrically connected separately in parallel to the first amplifying means, for amplifying the signal outputted from the input matching unit;

an output matching unit for performing an impedance matching the amplified signal from the first and second amplifying means and outputting the matched signal through an output terminal;

a first power control path for electrically connecting between the input matching unit and the output matching unit and including the first amplifying means therebetween;

a second power control path for electrically connecting between the input matching unit and the output matching unit and including the second amplifying means therebetween;

a bypass path for electrically connecting between the input matching unit and the output matching unit;

a control circuit unit for selectively outputting the predetermined path control signals to the first and second amplifying means on the basis of an antennal output signal outputted and applied from a predetermined control module, for example, an MSM (Mobile Station Modem), whereby the first and second power control paths or a bypass path are selected.

In another aspect of the present invention, there is provided a high efficiency power amplifier comprising:

an input matching unit for matching input signal;

a first amplifying means for amplifying the signal outputted from the input matching unit; the first amplifying means comprising:
  a first amplifier for amplifying firstly the signal outputted from the input matching unit;
  an intermediate part matching unit for receiving the signal outputted from the first amplifier and performing an impedance matching; and
  a second amplifier for amplifying and outputting the output signal from the intermediate part matching unit;

a second amplifying means, which is electrically connected separately to the input matching unit in parallel to the first amplifying means, for amplifying the signal outputted from the input matching unit; the second amplifying means comprising:
  a third amplifier for amplifying firstly the signal outputted from the input matching unit;
  an intermediate part matching unit for receiving the signal outputted from the third amplifier and performing an impedance matching; and
  a fourth amplifier for amplifying and outputting the output signal from the intermediate part matching unit;

an output matching unit for performing an impedance matching the amplified signal from the first and second amplifying means and outputting the matched signal through an output terminal;

a first power control path for electrically connecting between the input matching unit and the output matching unit and including the first amplifying means therebetween;

a second power control path for electrically connecting between the input matching unit and the output matching unit and including the second amplifying means therebetween;

a bypass path for electrically connecting between the input matching unit and the output matching unit;

a control circuit unit for selectively outputting the predetermined path control signals to the first and second amplifying means on the basis of an antennal output signal outputted and applied from a predetermined control module, an MSM (Mobile Station Modem), whereby when the first amplifying means is selected, the predetermined path control signal is directly outputted to the first and second amplifiers of the first amplifying means, when the second amplifying means is selected, the predetermined path control signal is directly outputted to the third and fourth amplifiers of the second amplifying means, so that the first and second amplifiers are simultaneously activated or the third and fourth amplifiers are simultaneously activated.

In another aspect of the present invention, there is provided a high efficiency power amplifier comprising:

an input matching unit for matching input signal;

a third amplifying means for amplifying the signal outputted from the input matching unit; the third amplifying means comprising: a fifth amplifier for amplifying firstly the signal outputted from the input matching unit; an intermediate part matching unit for receiving the signal outputted from the fifth amplifier and performing an impedance matching; and a sixth amplifier for amplifying and outputting the output signal from the intermediate part matching unit;

a seventh amplifier, which is electrically connected to the input matching unit in parallel to the fifth amplifier of the third amplifying means, for amplifying the signal outputted from the input matching unit;

an output matching unit for performing an impedance matching the amplified signal from the third amplifying means and the seventh amplifier and outputting the matched signal through an output terminal;

a first power control path for electrically connecting between the input matching unit and the output matching unit and including the third amplifying means therebetween;

a second power control path for electrically connecting between the input matching unit and the output matching unit and including the seventh amplifier therebetween;

a bypass path for electrically connecting between the input matching unit and the output matching unit;

a control circuit unit for selectively outputting the predetermined path control signals to the third amplifying means and the seventh amplifier on the basis of an antennal output signal outputted and applied from a predetermined control module, for example, an MSM (Mobile Station Modem), whereby when the third amplifying means is selected, the predetermined path control signal is directly outputted to the fifth and sixth amplifiers of the first amplifying means, when the seventh amplifier is selected, the predetermined path control signal is directly outputted to the seventh amplifier, so that the fifth and sixth amplifiers are simultaneously activated or the seventh amplifier is activated.

In another aspect of the present invention, there is provided a high efficiency power amplifier comprising:

an input matching unit for receiving a predetermined input signal and performing the received signal an impedance matching to the next terminal;

a fourth amplifying means, in which its input terminal is electrically connected to the input matching unit, for amplifying the signal outputted from the input matching unit; wherein the fourth amplifying means comprising: an eighth amplifier for amplifying firstly the output signal of the input matching unit; an intermediate part matching unit, in which its input terminal is electrically connected to the output terminal of the eighth amplifier, for matching the signal outputted from the eighth amplifier; and a ninth amplifier which is electrically connected to the intermediate part matching unit for amplifying firstly the output signal of the intermediate part matching unit; amplifier, for amplifying the signal outputted from the intermediate part matching unit;

an output matching unit for performing an impedance matching of the signal outputted from the ninth and tenth amplifiers and then outputting the matched signal through an output terminal;

a first power control path for electrically connecting between the intermediate part matching unit and the output matching unit and including the ninth amplifier between the output and input matching units;

a second power control path for electrically connecting between the intermediate part matching unit and the output matching unit and including the tenth amplifier between the output and input matching units;

a bypass path for electrically connecting between the intermediate part matching unit and the output matching unit; and a control circuit unit for selectively outputting the predetermined path control signals to the ninth and tenth amplifier on the basis of an antennal output signal outputted and applied from a predetermined control module, an MSM (Mobile Station Modem), whereby the first and second power control paths or a bypass path are selected.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A high efficiency power amplifier in accordance with preferred embodiments of the present invention will now be described in detail with reference to the accompanying drawings.

Firstly, PAE of the power amplifier is calculated by: "PAE(%)=(output RF power−input RF power)/input DC power×100". Here, when the input and output RF power is fixed, the efficiency of the power amplifier become larger when the input DC power become smaller. The present invention uses the above principle, that is, the devices having the much and little power consumption are controlled by a passive device matching method, that is, by the control of the bias voltage like a smart power amplifier, so that much output can be obtained by using a little DC input power.

Figure 1:
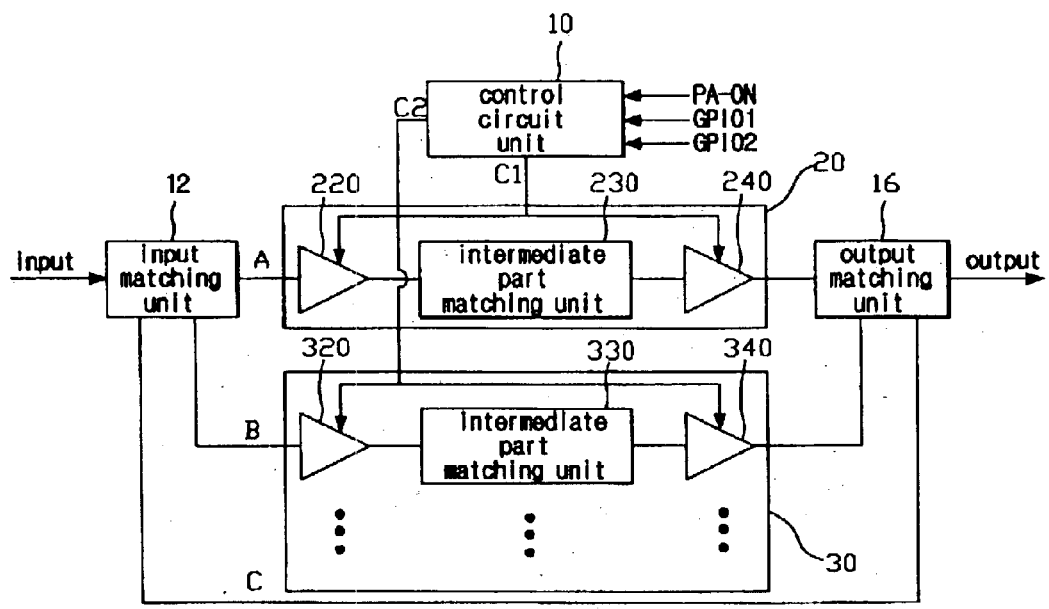
FIG. 1 is a view illustrating a construction of a high efficiency power amplifier according to a first embodiment of the present invention.

FIG. 1 is a view illustrating a construction of a high efficiency power amplifier according to a first embodiment of the present invention. The power amplifier comprises an input matching unit 12 for matching a predetermined input signal to the next terminal; a first amplifying means 20, which is electrically connected to the input matching unit 12, for amplifying the signal outputted from the input matching unit 12; a second amplifying means 30, which is electrically connected separately in parallel to the first amplifying means 20, for amplifying the signal outputted from the input matching unit 12; an output matching unit 16 for performing an impedance matching the amplified signal of the first or the second amplifying means 20 and 30 and outputting the matched signal through its output terminal; a first power control path A for electrically connecting the input matching unit 12 and the output matching unit 16 and including the first amplifying means 20 therebetween; a second power control path B for electrically connecting the input matching unit 12 and the output matching unit 16 and including the second amplifying means 30 therebetween; a bypass path C for electrically connecting the input matching unit 12 and the output matching unit 16; a control circuit unit 10 for selectively outputting the predetermined path control signals C1 and C2 to the first and second amplifying means 20 and 30 on the basis of an antenna output signal outputted and applied from a predetermined control module, an MSM (Mobile Station Modem), whereby the first and second power control paths A or B or the bypass path C are selected.

The first amplifying means 20 comprises: a first amplifier 20 for amplifying firstly the signal outputted from the input matching unit 12; an intermediate part matching unit 230 for receiving the signal outputted from the first amplifier 220 and performing an impedance matching; and a second amplifier 240 for amplifying the output signal outputted from the intermediate part matching unit 230 and outputting the amplified signal. The first amplifier 220 is a drive amplifier and the second amplifier 240 is a power amplifier for amplifying the power secondly.

Also, the second amplifying means 30 comprises: a third amplifier 320 for firstly amplifying the signal outputted from the input matching unit 12 and connected in parallel to the first amplifier 220; an intermediate part matching unit 330 for receiving the signal outputted from the third amplifier 320 and performing an impedance matching; and a fourth amplifier 340 for amplifying the output signal of the intermediate part matching unit 330 and outputting the amplified signal. Here, the third amplifier 320 is a driver amplifier and the fourth amplifier 340 is a power amplifier for amplifying the power secondly.

As described above, in the first embodiment of the present invention, a path of input matching unit 12—first amplifying means 20—output matching unit 16 is the first power control path A corresponding to the maximum power consumption region, a path of input matching unit 12—second amplifying means 30—output matching unit 16 is the second power control path B corresponding to the region having maximum frequency, and a path of input matching unit 12—output matching unit 16 is the bypass path C. In the first embodiment of the present invention, the power control paths are two, but there may be three or more.

Also, the devices, that is, the third and fourth amplifiers 320 and 340, of the second power control path B corresponding to the region having maximum frequency are smaller than the devices, that is, first and second amplifiers 220 and 240, of the first power control path A corresponding to the maximum power consumption region.

Also, signals such as PA-ON, GPIO1 and GPIO2 outputted from the control devices like an MSM etc. are inputted to the control circuit unit 10. The signal of PA-ON is for turning the power amplifier on, and the control signal 10 produces control signals C1 and C2 by performing the combination of output signals GPIO1 and GPIO2 of 2 bits. For example, when the signals of GPIO1 and GPIO2 all correspond to the high level (for example, "1"), the control circuit unit 10 outputs the path control signal C1, so that the first power control path A corresponding to the maximum power consumption region is selected, that is, activated. When the signal of GPIO1 corresponds to the high level and the signal of GPIO2 corresponds to the low level (for example, "0") or vice versa, the control circuit unit 10 outputs a path control signal C2, so that the second power control path B corresponding to the region having maximum frequency is selected, that is, activated. When the signals of GPIO1 and GPIO2 all correspond to the low level (for example, "0"), the control circuit unit 10 does not output any path control signal (that is, the first and second amplifying means 20 and 30 are non-activated all), so that the bypass path C is selected, that is, the output signal of the input matching unit 12 selects the bypass path C automatically and then is outputted to the output matching unit 16.

On the other hand, in the first embodiment, although the control circuit unit 10 produces control signals of 2 bits, the number of bits of the path control signals may be two or more bits.

An operation of the power amplifier according to the first embodiment of the present invention will be described as follows.

When an output signal of an antenna from the MSM etc., which is inputted to the control circuit unit 10, is high, for example, GPIO1 and GPIO2 are 1 all, the control circuit unit 10 outputs a path control signal C1 to the first amplifying means 20 on the first power control path A corresponding to the maximum power consumption region. Accordingly, the input signal inputted to the input matching unit 12 is outputted through the output matching unit 16 and the first power control path A. Here, when the first power control path A is selected, the second power control path B and the bypass path C are used for matching the input and output partly.

More specifically, the path control signal C1 is outputted to the first and second amplifiers 220 and 240 of the first amplifying means 20 and activates the respective amplifies 220 and 240, so that the output signal of the input matching unit 12 is amplified and transmitted through the first power control path A.

On the other hand, when an output signal of an antenna outputted from the MSM etc., which is inputted to the control circuit unit 10, is a signal showing an intermediate power, for example, GPIO1 and GPIO2 are opposite each other, 1 and 0 or vice versa, the control circuit unit 10 outputs a path control signal C2 to the second amplifying means 30 on the second power control path B corresponding to the region having maximum frequency. Accordingly, the input signal inputted to the input matching unit 12 is outputted through the output matching unit 16 and the second power control path B. Here, when the second power control path B is selected, the first power control path A and the bypass path C are used for matching the input and output partly.

More specifically, the path control signal C2 is outputted to the third and fourth amplifiers 320 and 340 of the second amplifying means 30 and activates the respective amplifies 320 and 340, so that the output signal of the input matching unit 12 is amplified and transmitted through the second power control path B.

Finally, when the output signal of an antenna outputted from the MSM etc., which is inputted to the control circuit unit 10, is a signal showing a low power, for example, GPIO1 and GPIO2 are 0 all, the control circuit unit 10 does not output a path control signal. Accordingly, the first and second amplifying means 20 and 30 are non-activated, the signal outputted from the input matching unit 12 is outputted through the output matching unit 16.

Here, the combination in the control circuit unit 10 may be performed by the free change of four signals, i.e., 11, 10, 01 and 00.

Figure 2:
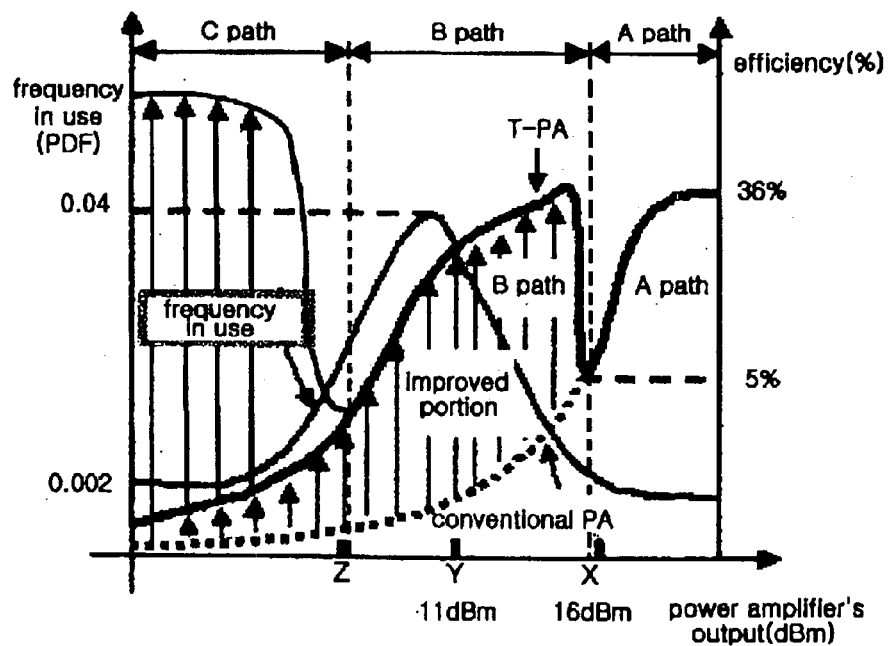
FIG. 2 is a graph illustrating the efficiency of a high efficiency power amplifier of FIG. 1.

Accordingly, the efficiency of the power amplifier of the first embodiment of the present invention has the maximum efficiency at the maximum power output and the intermediate power output, as shown in FIG. 2. By this, the power amplifier shows an increased efficiency characteristic in comparison with the conventional power amplifier. As shown in FIG. 2, the arrow mark of "conventional PA" shows the maximum efficiency at the maximum output of the conventional power amplifier and the arrow mark of "T-PA" shows the maximum efficiency at the maximum output and intermediate output of the power amplifier according to the first embodiment of the present invention. At the origin, as shown in FIG. 2, when the path is followed by the bypass path C, the efficiency may be 80% above.

Figure 3:
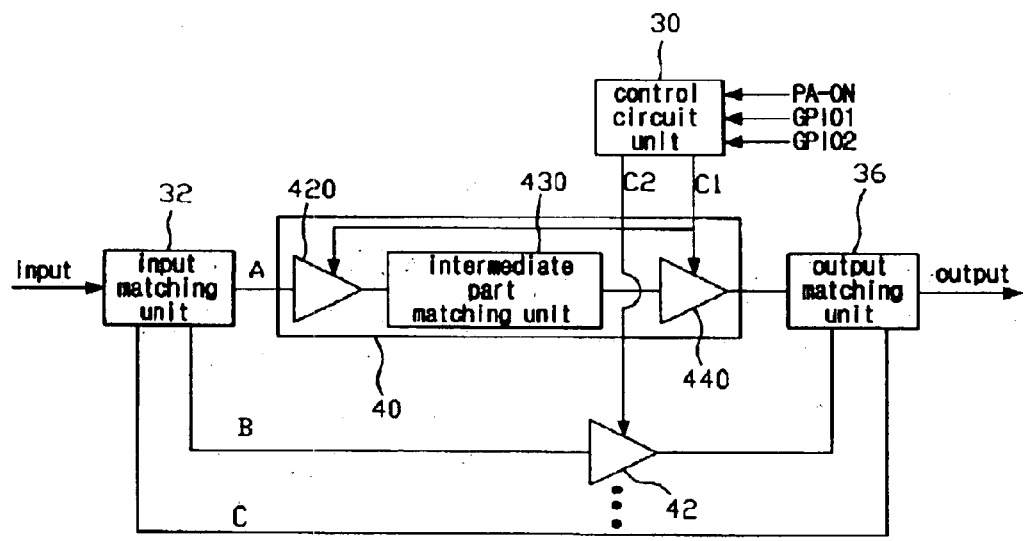
FIG. 3 is a view illustrating a construction of a high efficiency power amplifier according to a second embodiment of the present invention.

FIG. 3 is a view illustrating a construction of a high efficiency power amplifier according to a second embodiment of the present invention. The construction of FIG. 3 is similar to that of FIG. 1 and the difference will be described as follows.

In the first embodiment of the present invention, the control circuit unit 10 outputs path control signals C1 and C2 to the first and second amplifying means 20 and 30 of the power control paths A and B, that is, to the first to fourth amplifiers 220, 240, 320 and 340, whereas as shown in the second embodiment of FIG. 3, the control circuit unit 30 outputs path control signals C1 and C2 to the fifth and sixth amplifiers 420 and 440 of the third amplifying means 40 and the seventh amplifier 42, respectively. Also, in the first embodiment of the present invention, the first and second power control paths A and B include an amplifier and an intermediate part matching unit all, whereas in the second embodiment of the present invention, fifth and sixth amplifiers 420 and 440 and an intermediate part matching unit 430 are only installed to the first power control path A, that is, a power control path corresponding to the maximum power consumption region, the seventh amplifier 42 is installed to the second power control path B, that is, a power control path corresponding to the region having maximum frequency. Also, the bypass path C of FIG. 3 performs the same function of the bypass path C of FIG. 1.

The fifth amplifier 420 is a drive amplifier and the sixth amplifier 440 is a power amplifier for amplifying the power secondly.

Because the operation of the second embodiment in FIG. 3 is the same as that of the first embodiment in FIG. 1, a specific explanation will be omitted.

Figure 4:
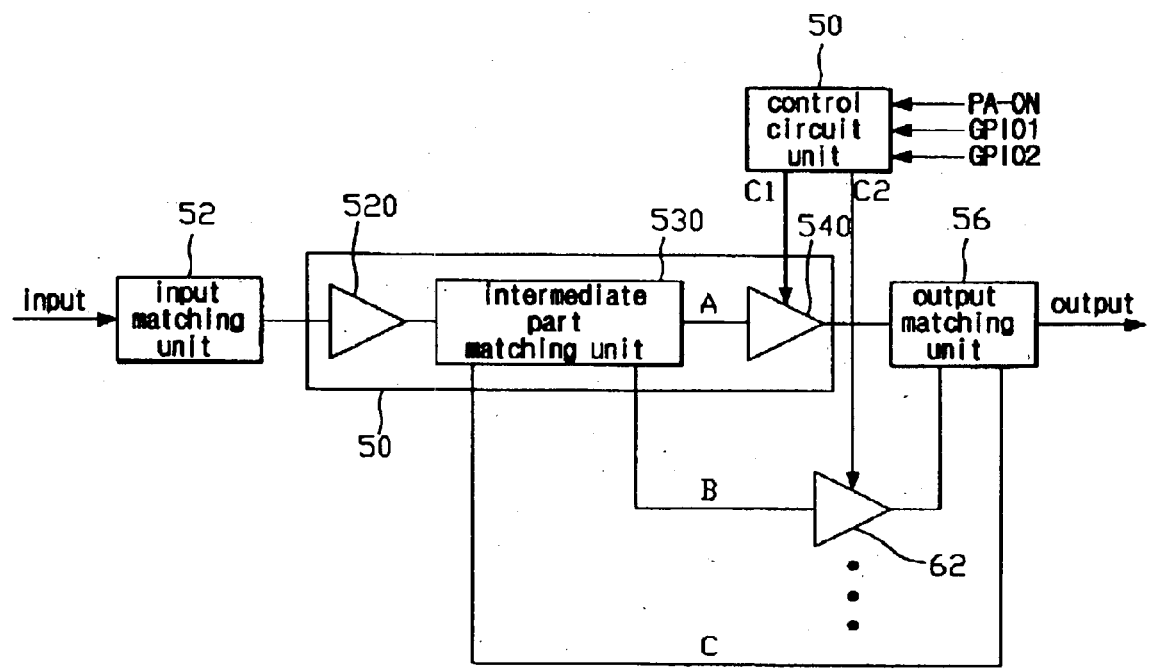
FIG. 4 is a view illustrating a construction of a high efficiency power amplifier according to a third embodiment of the present invention.

FIG. 4 is a view illustrating a construction of a high efficiency power amplifier according to a third embodiment of the present invention. The construction of FIG. 4 is similar to those of FIGS. 1 and 2. The difference between FIGS. 1, 2 and 4 will be described as follows. That is, in the first embodiment of the present invention, the control circuit unit 10 outputs path control signals C1 and C2 to the first and second amplifying means 20 and 30 of the power control paths A and B, that is, to the first to fourth amplifiers 220, 240, 320 and 340, in the second embodiment of FIG. 3, the control circuit unit 30 outputs path control signals C1 and C2 to the fifth and sixth amplifiers 420 and 440 of the third amplifying means 40 and the seventh amplifier 42. Whereas, in the third embodiment of the present invention, the control circuit unit 50 outputs predetermined path control signals C1 and C2 to the fourth amplifying means 50 connected between the input and output matching units 52 and 56 and the tenth amplifier 62. That is, the construction of the third embodiment of FIG. 4 is different from those of the first and second embodiments, specifically, the power amplifier of the third embodiment comprises: an input matching unit 52 for receiving a predetermined input signal and performing the received signal an impedance matching to the next terminal; a fourth amplifying means 50, in which its input terminal is electrically connected to the input matching unit 52, for amplifying the signal outputted from the input matching unit 52; wherein the fourth amplifying means 40 comprises an eighth amplifier 520 for amplifying firstly the output signal of the input matching unit 52; an intermediate-part matching unit 530, in which its input terminal is electrically connected to the output terminal of the eighth amplifier 520, for matching the signal outputted from the eighth amplifier 520; and a ninth amplifier 540, which is electrically connected to the intermediate part matching unit 530, for amplifying firstly the output signal of the intermediate part matching unit 530; a tenth amplifier 62, which is electrically connected to the intermediate part matching unit 530 in parallel to the ninth amplifier 540, for amplifying the signal outputted from the intermediate part matching unit 530; an output matching unit 56 for performing an impedance matching of the signal outputted from the ninth and tenth amplifiers 540 and 62 and then outputting the matched signal through an output terminal; a first power control path A for electrically connecting between the intermediate part matching unit 530 and the output matching unit 56 and including the ninth amplifier 540 between the output and input matching units 530 and 56; a second power control path B for electrically connecting between the intermediate part matching unit 530 and the output matching unit 56 and including the tenth amplifier 62 between the output and input matching units 530 and 56; a bypass path C for electrically connecting between the intermediate part matching unit 530 and the output matching unit 56; and a control circuit unit 50 for selectively outputting the predetermined path control signals C1 and C2 to the ninth and tenth amplifier 540 and 62 on the basis of an antennal output signal outputted and applied from a predetermined control module, for example, an MSM (Mobile Station Modem), whereby the first and second power control paths A or B or a bypass path C are selected.

Because the operation of the third embodiment in FIG. 4 is the same as that of the first embodiment in FIG. 1, a specific explanation will be omitted.

As described above, according to the high efficiency power amplifier of the present invention, there is no occurred the loss (about 0.5 dB above) which may be generated by switching, so that the power consumption is reduced and the efficiency of the power amplifier can be enhanced. Also, unbalance of the power amplifier caused by the use of switch is improved.

In special, a large number of optimization points capable of generating maximum efficiency, that is, a maximum power consumption region and the region having maximum frequency, are obtained, so the efficiency of the power amplifier is maximized. As a result, the power consumption of the mobile communication terminal can be decreased by above 50% maximum, so the mobile communication terminal having low power consumption can be manufactured.

As described above, according to the present invention, there is an effect that a telephone call time of the mobile communication terminal can be extended by 4 times in maximum.

The present invention can be applied to the whole system of the mobile communication terminal being required low power consumption.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A high efficiency power amplifier comprising:
   an input matching unit for matching a predetermined input signal to a next terminal;
   a first amplifying means for amplifying the signal outputted from the input matching unit;
   a second amplifying means, which is electrically connected in parallel to the first amplifying means, for amplifying the signal outputted from the input matching unit;
   an output matching unit for performing an impedance matching of the amplified signal from the first and second amplifying means and outputting the matched signal through an output terminal;
   a first power control path for electrically connecting between the input matching unit and the output matching unit and including the first amplifying means therebetween;
   a second power control path for electrically connecting between the input matching unit and the output matching unit and including the second amplifying means therebetween;
   a bypass path for electrically connecting between the input matching unit and the output matching unit;
   a control circuit unit for selectively outputting predetermined path control signals to the first and second amplifying means on the basis of an antennal output signal outputted and applied from a predetermined control module whereby the first and second power control paths or a bypass path are selected, wherein the first amplifying means comprises:
     a first amplifier for amplifying the signal outputted from the input matching unit;
     an intermediate part matching unit for receiving the signal outputted from the first amplifier and performing an impedance matching; and
     a second amplifier for amplifying and outputting the output signal from the intermediate part matching unit; and
   the second amplifying means comprises:
     a third amplifier for amplifying the signal outputted from the input matching unit;
     an intermediate part matching unit for receiving the signal outputted from the third amplifier and performing an impedance matching; and
     a fourth amplifier for amplifying and outputting the output signal from the intermediate part matching unit.

2. The high efficiency power amplifier in accordance with claim 1, wherein the first to fourth amplifiers are operated as active devices, which are activated by the control of the control unit and the rest are operated by passive devices.

3. The high efficiency power amplifier in accordance with claim 1, wherein, in the maximum output power, the third and fourth amplifiers of the second amplifying means have lower power output than the first and second amplifiers of the first amplifying means.

4. The high efficiency power amplifier in accordance with claim 1, wherein the first and third amplifiers are drive amplifiers for amplifying firstly and the second and fourth amplifiers are power amplifiers for amplifying the power secondly.

5. A high efficiency power amplifier comprising:
   an input matching unit for matching a predetermined input signal to a next terminal;
   a first amplifying means for amplifying the signal outputted from the input matching unit;
   a second amplifying means, which is electrically connected in parallel to the first amplifying means, for amplifying the signal outputted from the input matching unit;
   an output matching unit for performing an impedance matching of the amplified signal from the first and second amplifying means and outputting the matched signal through an output terminal;
   a first power control path for electrically connecting between the input matching unit and the output matching unit and including the first amplifying means therebetween;
   a second power control path for electrically connecting between the input matching unit and the output matching unit and including the second amplifying means therebetween;
   a bypass path for electrically connecting between the input matching unit and the output matching unit;
   a control circuit unit for selectively outputting predetermined path control signals to the first and second amplifying means on the basis of an antennal output signal outputted and applied from a predetermined control module whereby the first and second power control paths or a bypass path are selected, wherein the first amplifying means comprises:
     a fifth amplifier for amplifying the signal outputted from the input matching unit;
     an intermediate part matching unit for receiving the signal outputted from the first amplifier and performing an impedance matching; and
     a sixth amplifier for amplifying and outputting the output signal from the intermediate part matching unit; and
   the second amplifying means comprises a seventh amplifier.

6. The high efficiency power amplifier in accordance with claim 5, wherein the first to seventh amplifiers are operated as active devices, which are activated by the control of the control unit and the rest are operated by passive devices.

7. The high efficiency power amplifier in accordance with claim 5, wherein, in the maximum output power, the seventh amplifier of the second amplifying means has a lower power output than the fifth and sixth amplifiers of the first amplifying means.

8. The high efficiency power amplifier in accordance with claim 5, wherein the fifth amplifier is a drive amplifier for amplifying firstly and the sixth amplifier is a power amplifier for amplifying the power secondly.

9. A high efficiency power amplifier comprising:
an input matching unit for matching a predetermined input signal to a next terminal;
a first amplifying means for amplifying the signal outputted from the input matching unit;
a second amplifying means, which is electrically connected in parallel to the first amplifying means, for amplifying the signal outputted from the input matching unit;
an output matching unit for performing an impedance matching of the amplified signal from the first and second amplifying means and outputting the matched signal through an output terminal;
a first power control path for electrically connecting between the input matching unit and the output matching unit and including the first amplifying means therebetween;
a second power control path for electrically connecting between the input matching unit and the output matching unit and including the second amplifying means therebetween;
a bypass path for electrically connecting between the input matching unit and the output matching unit;
a control circuit unit for selectively outputting predetermined path control signals to the first and second amplifying means on the basis of an antennal output signal outputted and applied from a predetermined control module whereby the first and second power control paths or a bypass path are selected, and wherein the power amplifier has one or more first and second power control paths.

10. A high efficiency power amplifier comprising:
an input matching unit for matching a predetermined input signal to a next terminal;
a first amplifying means for amplifying the signal outputted from the input matching unit;
a second amplifying means, which is electrically connected in parallel to the first amplifying means, for amplifying the signal outputted from the input matching unit;
an output matching unit for performing an impedance matching of the amplified signal from the first and second amplifying means and outputting the matched signal through an output terminal;
a first power control path for electrically connecting between the input matching unit and the output matching unit and including the first amplifying means therebetween;
a second power control path for electrically connecting between the input matching unit and the output matching unit and including the second amplifying means therebetween;
a bypass path for electrically connecting between the input matching unit and the output matching unit;
a control circuit unit for selectively outputting the predetermined path control signals to the first and second amplifying means on the basis of an antennal output signal outputted and applied from a predetermined control module whereby the first and second power control paths or a bypass path are selected, and wherein the antenna output signal inputted to the control circuit unit is a 2 bit signal, and the control circuit unit combines the 2 bit signal and produces path control signals for selecting one path control path among one or more power control paths.

11. A high efficiency power amplifier comprising:
an input matching unit for matching an input signal;
a first amplifying means for amplifying the signal outputted from the input matching unit; the first amplifying means comprising:
a first amplifier for amplifying the signal outputted from the input matching unit;
an intermediate part matching unit for receiving the signal outputted from the first amplifier and performing an impedance matching; and
a second amplifier for amplifying and outputting the output signal from the intermediate part matching unit;
a second amplifying means, which is electrically connected separately to the input matching unit in parallel to the first amplifying means, for amplifying the signal outputted from the input matching unit; the second amplifying means comprising:
a third amplifier for amplifying the signal outputted from the input matching unit;
an intermediate part matching unit for receiving the signal outputted from the third amplifier and performing an impedance matching; and
a fourth amplifier for amplifying and outputting the output signal from the intermediate part matching unit;
an output matching unit for performing an impedance matching of the amplified signal from the first and second amplifying means and outputting the matched signal through an output terminal;
a first power control path for electrically connecting between the input matching unit and the output matching unit and including the first amplifying means therebetween;
a second power control path for electrically connecting between the input matching unit and the output matching unit and including the second amplifying means therebetween;
a bypass path for electrically connecting between the input matching unit and the output matching unit;
a control circuit unit for selectively outputting the predetermined path control signals to the first and second amplifying means on the basis of an antennal output signal outputted and applied from a predetermined control module whereby when the first amplifying means is selected, the predetermined path control signal is directly outputted to the first and second amplifiers of the first amplifying means, when the second amplifying means is selected, the predetermined path control signal is directly outputted to the third and fourth amplifiers of the second amplifying means, so that the first and second amplifiers are simultaneously activated or the third and fourth amplifiers are simultaneously activated.

12. The high efficiency power amplifier in accordance with claim 11, wherein the first to fourth amplifiers are operated as active devices, which are activated by the control of the control unit and the rest are operated by passive devices.

13. The high efficiency power amplifier in accordance with claim 11, wherein, when operating at maximum output power, the third and fourth amplifiers of the second amplifying means have a lower power output than the first and second amplifiers of the first amplifying means.

14. The high efficiency power amplifier in accordance with claim 11, wherein the first and third amplifiers are a drive amplifier for amplifying and the second and fourth amplifiers are power amplifiers for amplifying the power.

15. The high efficiency power amplifier in accordance with claim 11, wherein the power amplifier has one or more first and second power control paths.

16. The high efficiency power amplifier in accordance with claim 11, wherein the antenna output signal inputted to the control circuit unit is a 2 bit signal, and the control circuit unit combines the 2 bit signal and produces path control signals for selecting one path control path among one or more power control paths.

17. A high efficiency power amplifier comprising:

an input matching unit for matching input signal;

a third amplifying means for amplifying the signal outputted from the input matching unit; the third amplifying means comprising: a fifth amplifier for amplifying the signal outputted from the input matching unit; an intermediate part matching unit for receiving the signal outputted from the fifth amplifier and performing an impedance matching; and a sixth amplifier for amplifying and outputting the output signal from the intermediate part matching unit;

a seventh amplifier, which is electrically connected to the input matching unit in parallel to the fifth amplifier of the third amplifying means, for amplifying the signal outputted from the input matching unit;

an output matching unit for performing an impedance matching of the amplified signal from the third amplifying means and the seventh amplifier and outputting the matched signal through an output terminal;

a first power control path for electrically connecting between the input matching unit and the output matching unit and including the third amplifying means therebetween;

a second power control path for electrically connecting between the input matching unit and the output matching unit and including the seventh amplifier therebetween;

a bypass path for electrically connecting between the input matching unit and the output matching unit;

a control circuit unit for selectively outputting the predetermined path control signals to the third amplifying means and the seventh amplifier on the basis of an antennal output signal outputted and applied from a predetermined control module whereby when the third amplifying means is selected, the predetermined path control signal is directly outputted to the fifth and sixth amplifiers of the first amplifying means, when the seventh amplifier is selected, the predetermined path control signal is directly outputted to the seventh amplifier, so that the fifth and sixth amplifiers are simultaneously activated or the seventh amplifier is activated.

* * * * *